(12) United States Patent
Madni et al.

(10) Patent No.: US 6,876,843 B2
(45) Date of Patent: Apr. 5, 2005

(54) RADIO FREQUENCY AMPLIFIER WITH IMPROVED INTERMODULATION PERFORMANCE

(75) Inventors: Arshad Madni, Swindon (GB); Mark Mudd, Swindon (GB)

(73) Assignee: Zarlink Semiconductor Limited (GB)

( * ) Notice: Subject to any disclaimer, the term of this patent is extended or adjusted under 35 U.S.C. 154(b) by 405 days.

(21) Appl. No.: 10/056,155

(22) Filed: Jan. 24, 2002

(65) Prior Publication Data

US 2002/0137486 A1 Sep. 26, 2002

(30) Foreign Application Priority Data

Jan. 24, 2001 (GB) .............................................. 0101784

(51) Int. Cl.$^7$ ................................................. H04B 1/00
(52) U.S. Cl. ........................ 455/311; 455/341; 455/333
(58) Field of Search ............................. 455/333, 232.1, 455/323, 326, 293, 311, 341; 330/252, 255, 260, 261; 327/555, 560, 355

(56) References Cited

U.S. PATENT DOCUMENTS

| | | | |
|---|---|---|---|
| 3,829,789 A | | 8/1974 | Mulder |
| 4,379,268 A | * | 4/1983 | Nagata ........................ 330/260 |
| 4,912,520 A | * | 3/1990 | Yamamoto et al. .......... 455/333 |
| 5,140,281 A | | 8/1992 | Fujisawa et al. |
| 5,379,457 A | * | 1/1995 | Nguyen ........................ 455/323 |
| 5,438,296 A | * | 8/1995 | Kimura ........................ 327/560 |
| 5,463,354 A | * | 10/1995 | Calder et al. .................. 331/65 |
| 5,572,165 A | * | 11/1996 | Madni .......................... 330/252 |
| 5,760,632 A | * | 6/1998 | Kawakami et al. .......... 327/355 |
| 6,538,501 B2 | * | 3/2003 | Madni .......................... 327/563 |
| 6,642,787 B1 | * | 11/2003 | Souetinov et al. ........... 330/252 |
| 6,667,658 B2 | * | 12/2003 | Bourgoin et al. ............ 330/255 |
| 6,727,746 B2 | * | 4/2004 | Madni et al. ................ 327/560 |

FOREIGN PATENT DOCUMENTS

| | | |
|---|---|---|
| GB | 2223902 | 4/1990 |
| WO | 91/12573 | 8/1991 |

* cited by examiner

Primary Examiner—Sonny Trinh
(74) Attorney, Agent, or Firm—Thompson Hine LLP

(57) ABSTRACT

A radio frequency amplifier of improved intermodulation performance is provided by connecting first and second transconductance amplifiers in antiphase so that third order intermodulation products cancel each other but the reduction in gain is relatively small. The transconductance stages comprise long tail pairs of transistors provided with tail current sources formed by transistors whose bases are connected to a bias voltage source. The first transistor has an emitter connected via a resistor to ground. The second transistor has an emitter connected via another resistor to the emitter of the first transistor.

13 Claims, 4 Drawing Sheets

US 6,876,843 B2

RADIO FREQUENCY AMPLIFIER WITH IMPROVED INTERMODULATION PERFORMANCE

FIELD OF THE INVENTION

The present invention relates to an amplifier. Such an amplifier may, for example, be used at radio or intermediate frequencies, for example within a radio tuner. The present invention also relates to a radio tuner including such an amplifier.

SUMMARY OF THE INVENTION

According to a first aspect of the invention, there is provided an amplifier comprising a first long tail pair of transistors, a second long tail pair of transistors, and a current source for setting the tail currents of the first and second long tail pairs in a predetermined ratio, the current source comprising at least one first bipolar transistor whose collector forms a first current source output, whose base is connected to a bias voltage source, and whose emitter is connected via a first resistance to a supply input; and a second bipolar transistor whose emitter forms a second current source output, whose base is connected to the bias voltage source, and whose emitter is connected via a second resistance to the emitter of the first transistor.

The at least one first transistor may comprise a plurality of parallel-connected transistors.

The value of the second resistance may be substantially equal to:

$$\frac{Vt.\lambda}{I}\ln\left(\frac{\lambda}{n}\right)$$

Where ln is the natural logarithm, I is the output current of the first current source output, Vt is thermal voltage, $\lambda$ is the predetermined ratio, and n is number of transistors forming the first transistor.

The first and second long, tail pairs may have outputs connected to cross-connected first and second differential pairs of transistors.

The first long tail pair may comprise third and fourth transistors whose input terminals are connected to first and second inputs, respectively, of the amplifier and whose common terminals are connected via third and fourth resistances, respectively, to the first current source output. The third and fourth transistors may be bipolar transistors, the second amplifier input may be connected at signal frequencies to a common line, and the value of the third resistance may be substantially equal to the value of the fourth resistance plus $(Zs/\beta_1)$, where Zs is a source impedance to which the first amplifier input is to be connected and $\beta_1$ is the current gain of the third transistor.

The second long tail pair may comprise fifth and sixth transistors whose input terminals are connected to first and second inputs, respectively, of the amplifier, whose common terminals are connected via fifth and sixth resistances, respectively, to the second source output, and whose output terminals are connected to output terminals of the fourth and third transistors, respectively. The fifth sixth transistors may be bipolar transistors and the value of the filter resistance may be substantially equal to the value of the sixth resistance plus $(Zs/\beta_2)$, where $\beta_2$ is the current gain of the fifth transistor.

The second amplifier input may be connected to the common line by a capacitor.

According to a second aspect of the invention, there is provided an amplifier comprising: a first current source; a first bipolar transistor having a base for connection to a signal source having a source impedance Zs and an emitter connected via a first resistance to the first current source; and a second bipolar transistor having a base connected at signal frequencies to a common line and an emitter connected via a second resistance to the first current source, the value of the first resistance being substantially equal to the value of the second resistance plus $(Zs/\beta_1)$, where $\beta_1$ is the current gain of the first transistor.

The amplifier may comprise: a second current source; a third bipolar transistor having a base connected to the base of the first transistor, an emitter connected via a third resistance to the second current source, and a collector connected to the collector of the second transistor, and a fourth bipolar transistor having a base connected to the base of the second transistor, an emitter connected via a fourth resistance to the second current source, and a collector connected to the collector of the first transistor, the value of the third resistance being substantially equal to the value of the fourth resistance plus $(Zs/\beta_2)$, where $\beta_2$ is the current gain of the first transistor.

The base of the second transistor may be connected to the common line by a capacitor.

According to a third aspect of the invention, there is provided a radio tuner including an amplifier according to the first or second aspect of the invention.

BRIEF DESCRIPTION OF THE DRAWINGS

The invention will be further described, by way of example, with reference to the accompanying drawings, in which.

DESCRIPTION OF THE PREFERRED EMBODIMENT

Figure 1:
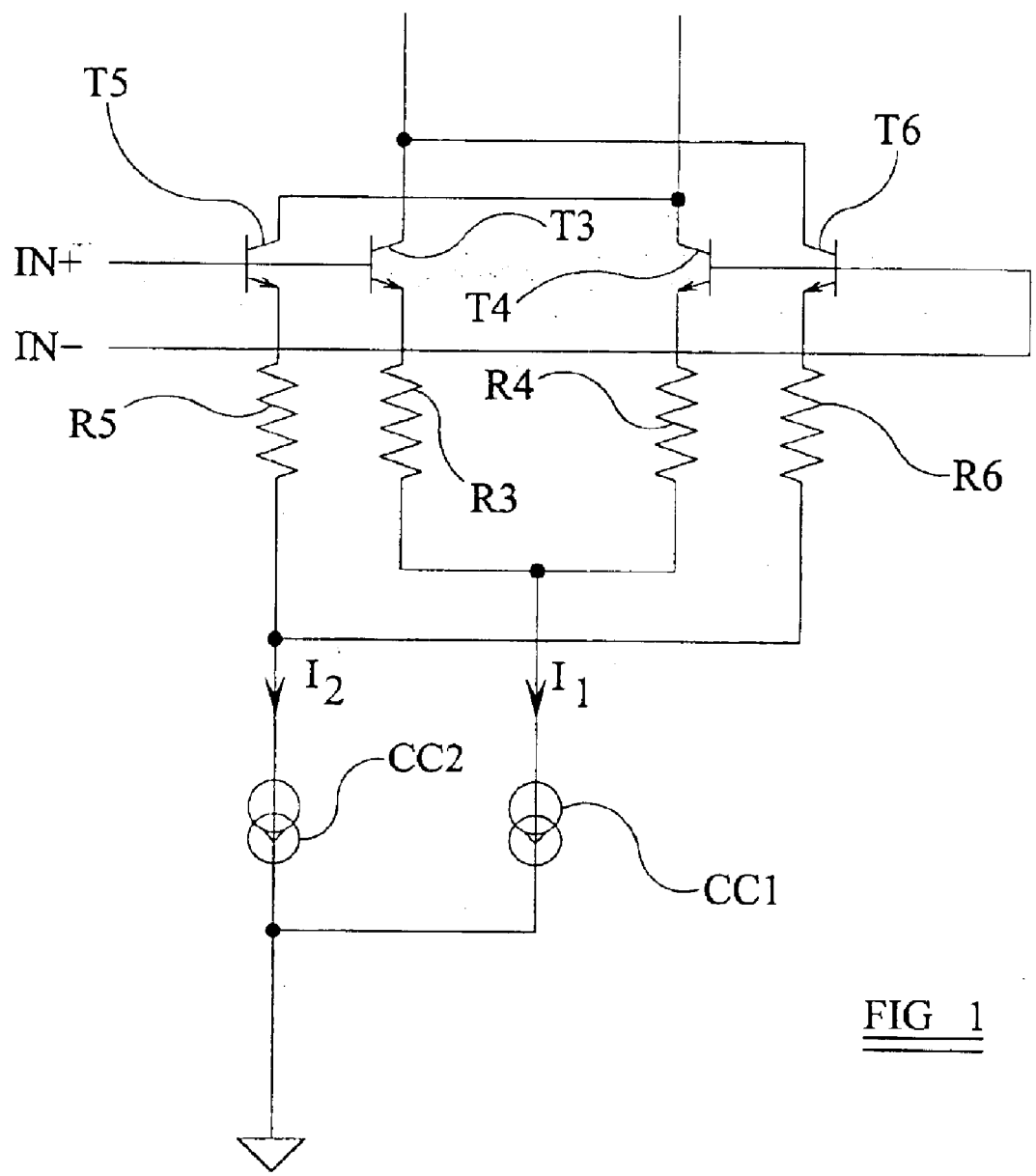
FIG. 1 is a circuit diagram of a transconductance amplifier to which the present invention may be applied.

The transconductance amplifier shown in FIG. 1 is of a type which is suitable for use as the first stage or low noise amplifier (LNA) of a radio frequency tuner, for example for receiving radio frequency input signals from a cable distribution network or from a satellite or terrestrial aerial. This transconductance stage is not an embodiment of the invention but is shown to illustrate a problem which the invention overcomes.

Low noise amplifiers are required to have a low noise figure while maintaining a high "II3" or third order intermodulation performance. The transconductance amplifier shown in FIG. 1 comprises two individual transconductance amplifier stages which are cross-connected so as to reduce intermodulation distortion. The first or main stage comprises a long tail pair of bipolar transistors T3 and T4 whose bases are connected to differential inputs IN+ and IN−, respectively. The emitters of the transistors T3 and T4 are connected via resistors R3 and R4, respectively, to one terminal of a constant current source CC1 whose other terminal is connected to ground. The constant current source CC1 supplies a current $I_1$.

The other or subsidiary stage likewise comprises a long tail pair of bipolar transistors T5 and T6 whose bases are connected to the differential inputs IN+ and IN−, respectively. The emitters of the transistors T5 and T6 are connected via resistors R5 and R6, respectively, to a second constant current source CC2 which supplies a tail current $I_2$. The cross-coupling of the main and subsidiary stages is achieved by connecting the collector of the transistor T5 to the collector of the transistor T4 and by connecting the collector of the transistor T6 to the collector of the transistor T3 so that the stage outputs are out of phase and the output of the subsidiary stage in the form of the differential collector current is subtracted from the output of the main stage.

The transconductance of the main stage comprising the transistors T3 and T4 is approximated by the following expression:

$$gm1.v + \alpha.v^3$$

where gm1 is the linear component of the transconductance, $\alpha$ is the coefficient of the third order part of the transconductance and v is the input voltage.

Similarly, to a good approximation, the transconductance of the subsidiary stage is given by:

$$gm2.v + \alpha.v^3$$

where gm2 is the linear part of the stage transconductance. The transconductance of the whole transconductance amplifier is given by the difference between the transconductances of the individual stages, namely:

$$gm1.v + \alpha.v^3 - gm2.v - \alpha.v^3 = (gm1 - gm2)v$$

The main and subsidiary stages are designed such that the third order transconductance terms cancel each other out whereas the linear terms are substantially different so that the diffraction between them is nonzero. In practice, it is possible to make the transconductance gm1 of the main stage much greater than the transconductance gm2 of the subsidiary stage so that the final transconductance of the whole amplifier is less than that of the main stage by only a small percentage. Typically, the value of each of the resistors R5 and R6 is one tenth of the value of each of the resistors R3 and R4 and the tail current I2 of the subsidiary stage is one hundredth of the tail current I1 of the main stage. This results in a loss of gain (compared with that of the main stage alone) of about 2% but provides a very substantial increase in the intermodulation performance or IIP3.

In order for a good performance to be achieved in practice, the ratio of the currents $I_1$ and $I_2$ must be defined and maintained to a high degree of accuracy. This creates difficulties because of the need to maintain the ratio $I_1:I_2$ at one hundred.

Figure 2:
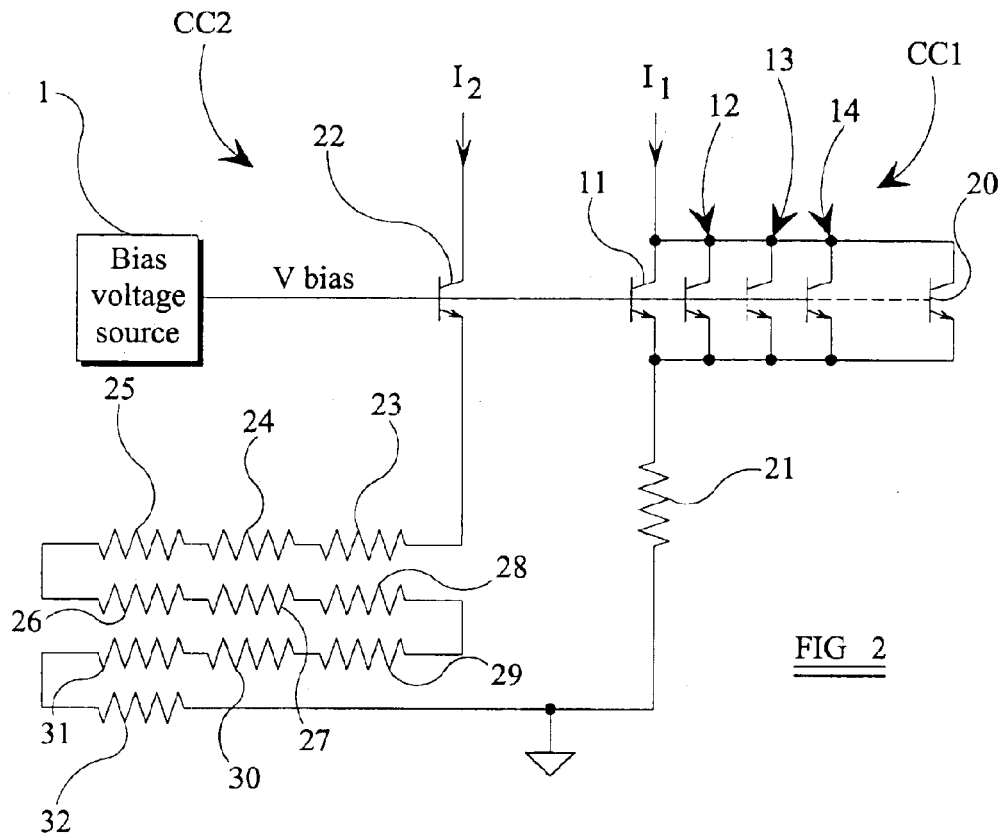
FIG. 2 is a circuit diagram of the current sources used in the amplifier of FIG. 1.

FIG. 2 illustrates a conventional way of achieving such a large current ratio. The two current sources CC1 and CC2 are connected to a common bias voltage source 1, which supplies a substantially constant bias voltage Vbias. This first constant current source CC1 comprises ten bipolar transistors 11–20 connected in parallel with their bases connected to the bias voltage source 1, their emitters connected via a resistor 21 to ground, and their collectors connected together to form the output of the current source.

The second current source CC2 comprises a single transistor 22 whose collector forms the current source output, whose base is connected to the bias voltage source 1 and whose emitter is connected via a chain of ten series-connected resistors 23–32 to ground. The value of each of the resistors 23–32 is equal to the value of the resistor 21.

The twin current source of FIG. 2 in fact achieves a current ratio of 10:1 but illustrates the difficulty in that the current-setting resistances in the emitter circuits have to have values which are in the same ratio as the desired currents. The current-setting resistors for the second current source CC2 thus occupy a very large area, for example of an integrated circuit in which the amplifier is formed.

Figure 3:
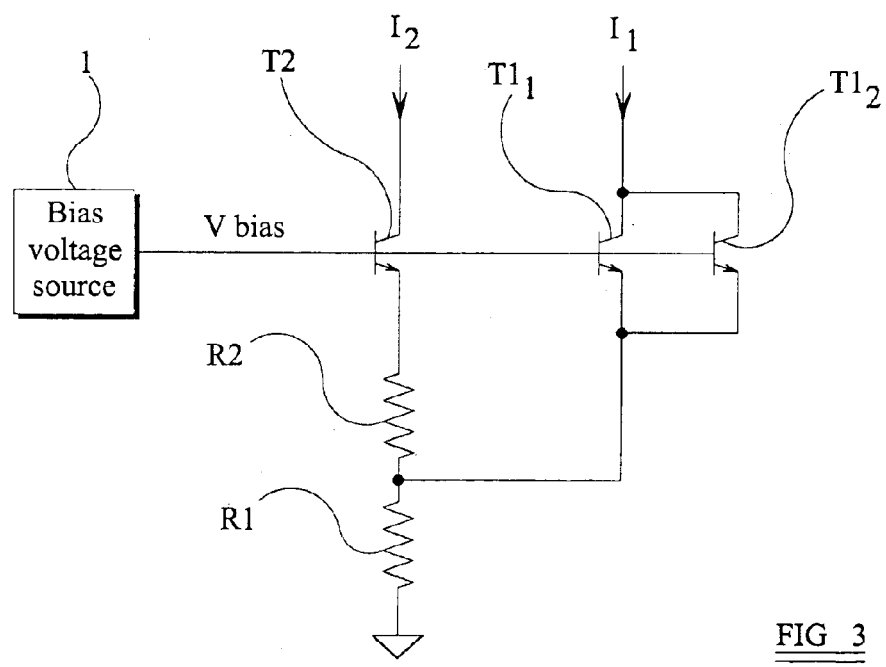
FIG. 3 is a circuit diagram of a twin current source for use in the invention.

FIG. 3 shows a twin current source which does not suffer from such disadvantages, requiring only a relatively small area of silicon for fabrication. This arrangement comprises a bias voltage source 1 of the same type as shown in FIG. 2 connected to the bases of transistors $T1_1$, $T1_2$, and T2. The part of the twin current source supplying the larger current $I_1$ comprises one or more transistors, illustrated in this particular embodiment as two parallel-connected transistors $T1_1$ and $T_2$. These transistors have bases connected to the bias voltage source 1, emitters connected via a resistor R1 to ground or any appropriate common or power supply line, and collectors connected together and forming the output for the larger current $I_1$.

The smaller current $I_2$ is supplied by the collector of the transistor T2, whose base is connected to the bias voltage source 1 and whose emitter is connected to a first terminal of a resistor R2, whose second terminal is connected to the emitters of the transistors $T1_1$ and $T1_2$ and to the resistor R1.

This twin current source makes use of a mismatch in transistor geometries in order to generate the different currents $I_1$ and $I_2$. The voltage drop across the base/emitter junction of the transistor T2 and the resistor R2 is equal to the base/emitter voltage of the transistors $T1_1$ and $T1_2$ that is:

$$Vbc_{T2} + I_2.R = Vbc_{T1}$$

where R is the value of the resistor R2. The collector current of the transistors $T1_1$ and $T1_2$ is given by:

$$Vbc_{T1} = Vt.\ln\left(\frac{I_1}{I_s}\right)$$

Where Vt is the thermal voltage, ln is the natural logarithm and Is is the saturation current.

A similar expression applies to the transistor T2 and this allows the base/emitter junction voltage drops to be replaced as follows:

$$I_2.R = Vt.\ln\left(\frac{I_1}{2.I_s}\right) - Vt.\ln\left(\frac{I_2}{I_s}\right)$$

This may be simplified by replacing the ratio $I_1/I_2$ with $\lambda$ to give:

$$\frac{I_1.R}{\lambda} = Vt.\ln\left(\frac{\lambda}{2}\right)$$

which may be rewritten as:

$$R = \frac{\lambda}{I_1} Vt.\ln\left(\frac{\lambda}{2}\right)$$

Figure 4:
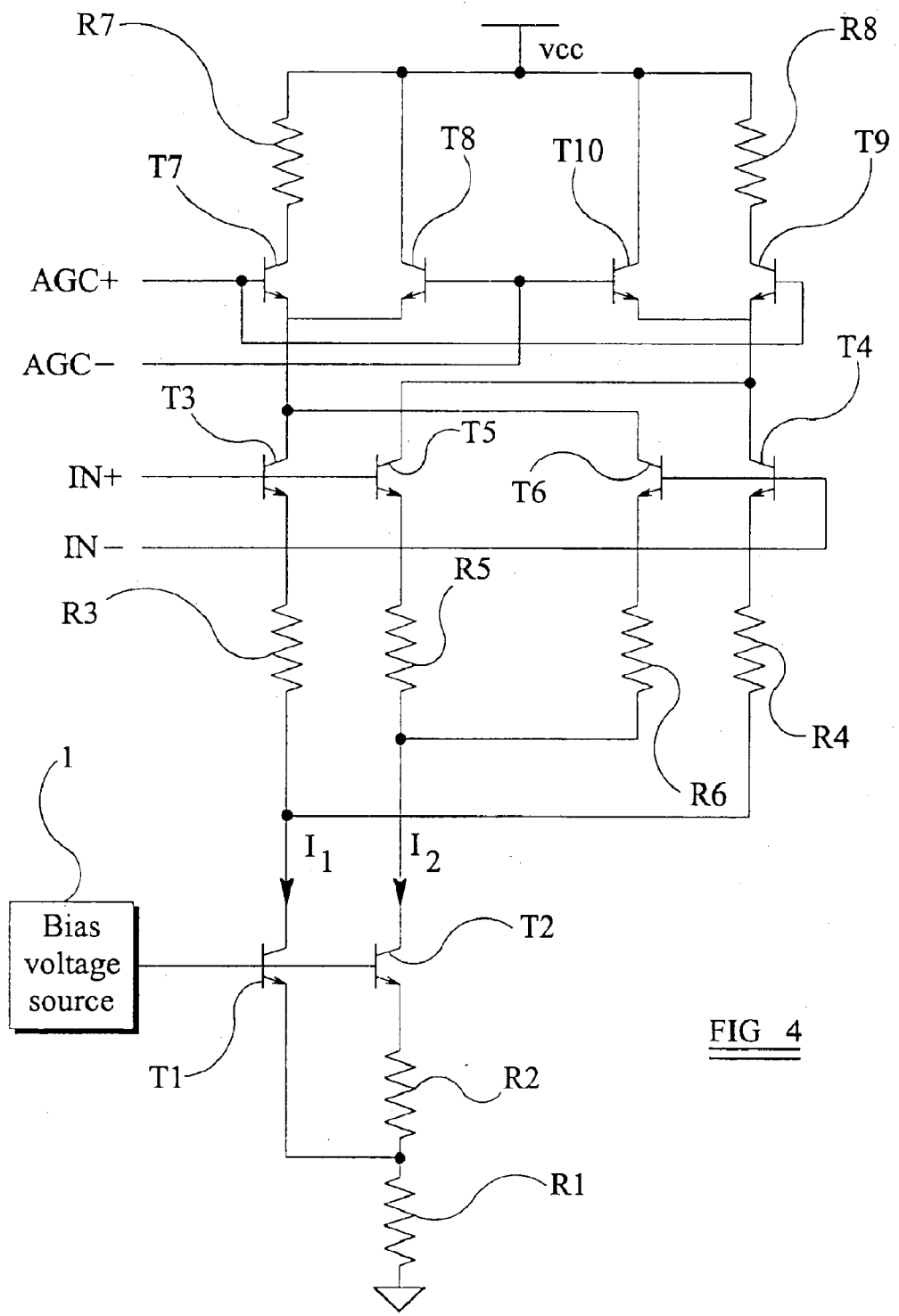
FIG. 4 is a circuit diagram of an amplifier constituting an embodiment of the invention.

FIG. 4 illustrates an embodiment of the present invention in the form of an LNA for use as the first stage of a radio frequency tuner and incorporating the variable gain circuitry of an automatic gain control (AGC) circuit. The amplifier comprises a transconductance amplifier of the type illustrated in figure but in which the current sources CC1 and CC2 are replaced by the twin current source shown in FIG. 3. The collectors of the transistors T3 and T6 are connected to the emitters of differentially connected transistors T7 and T8 whose bases are connected to differential inputs AGC+ and AGC− for receiving a gain control voltage for controlling the gain of the LNA. The collector of the transistor T7 is connected via a load resistor R7 to a supply line vcc whereas the collector of the transistor T5 is connected directly to the supply line vcc. The collectors of the transistors T4 and T5 are similarly connected to the emitters of differentially connected transistors T9 and T10 whose bases are connected to the control voltage inputs AGC+ and AGC−, respectively. The collector of the transistor 19 is connected via a load resistor R8 to the supply line vcc whereas the collector of the transistor T10 is connected directly to the supply line vcc. Differential output signals of the LNA are generated across the load resistors R7 and R8 and are supplied to subsequent stages of the tuner, such as to a frequency changer.

As described hereinbefore, in a typical implementation of the LNA shown in FIG. 4, the main stage current $I_1$ is required to be one hundred (or of the order of one hundred) times the value the subsidiary stage current $I_2$. A current ratio of 40 may be achieved in a typical implementation with the resistors R1 and R2 having values of 10 ohms and 24 ohms, respectively, the transistor T1 having an emitter area twenty times that of the transistor T2 (or comprising twenty parallel-connected transistors, each of the same size as the transistor T2), and the currents $I_1$ and $I_2$, being 40 and 1 milliamp, respectively.

The LNA shown in FIG. 4 can readily be implemented on or as part of an integrated circuit and does not require an excessively large area of the substrate for fabrication. The amplifier has a grain and noise figure similar to those of conventional amplifiers but can achieve an improvement in IIP3 typically of 15 db. Furthermore, such improvement in performance can be maintained over a large temperature range, in particular throughout the whole permissible operating temperature range of an integrated circuit. The twin circuit source maintains the required ratio of currents $i_1:i_2$ throughout the temperature range but the actual currents vary throughout the temperature range so as to compensate for other temperature-related effects and maintain the improvements in IIP3.

Figure 5:
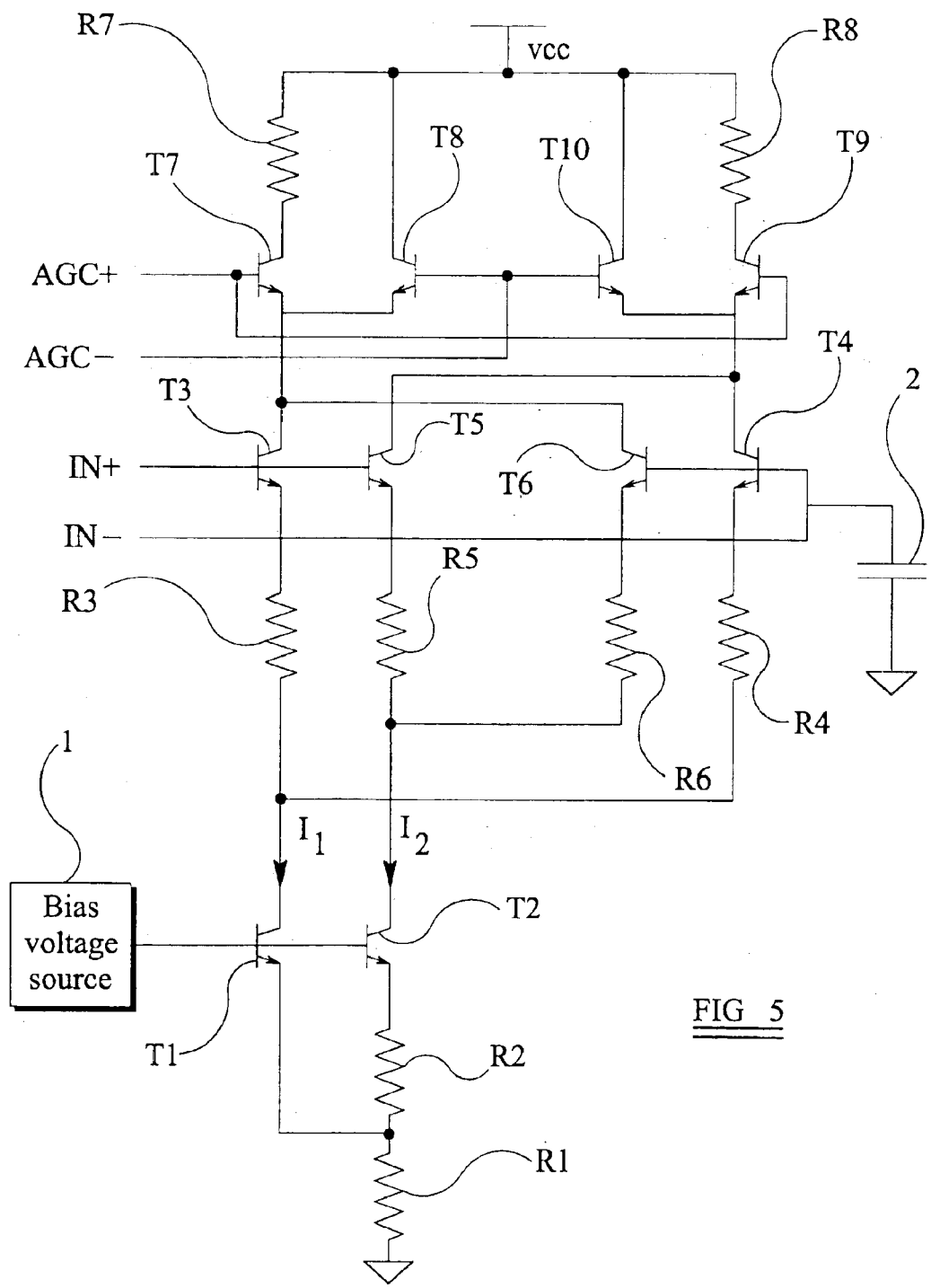
FIG. 5 is a circuit diagram of the amplifier shown in FIG. 4 but modified for receiving a single-ended input.

The amplifier shown in FIG. 4 is intended for use with balanced or differential inputs supplied to its input terminals IN+ and IN−. However, it is common for the input to such an amplifier to be single-ended and the amplifier 5 may be connected for operation with such a single-ended input source. In this case, as shown in FIG. 5, the amplifier has a single input IN and the bases of the transistors T4 and T6 are connected to ground via a capacitor 2. In particular, the capacitor 2 has a relatively low impedance for all signal frequencies which may be supplied to the input IN but isolates the bases of the transistors T4 and T6 from ground for direct current so as to prevent interference with base biasing arrangements (not shown). The input IN is intended to be connected to a signal source, such as a cable distribution network or aerial, having a well-defined characteristic source impedance.

The presence of the source impedance introduces an offset because the effective transconductance of the amplifier is unbalanced. However, this can be compensated by making the value of the emitter resistor R5 slightly larger than the value of the emitter resistor R6 and by making the value of the emitter resistor R3 slightly larger than the value of the emitter resistor R4. In particular, the value of each of the resistors R3 and R5 is made greater than the value of the resistor R4 and R6, respectively, by the amount $Zs/\beta$, where Zs is the source impedance of the signal source connected to the input IN and $\beta$ is the current gain of the transistor T3 or T5 as appropriate. This offsetting of the emitter resistor values provides a further improvement in both IIP3 and IIP2 for single-ended inputs as compared with no offsetting of the emitter degeneration resistors

What is claimed is:

1. An amplifier comprising a first long tail pair of transistors, a second long tail pair of transistors, and a constant current source for setting tail currents of the first and second long tail pairs in a predetermined ratio, the current source comprising: a supply input; a first resistance; a second resistance; at least one first bipolar transistor having a collector forming a first constant current source output, a base connected to a bias voltage source, and an emitter connected exclusively via said first resistance to said supply input; and a second bipolar transistor having a collector forming a second constant current source output, a base connected to said bias voltage source, and an emitter connected exclusively via said second resistance to said emitter of said first transistor so that said emitter of said second transistor is connected to said supply input exclusively via said first and second resistances in series.

2. An amplifier as claimed in claim 1, in which said at least one first transistor comprises a plurality of parallel-connected transistors.

3. An amplifier as claimed in claim 1, in which said second resistance has a value substantially equal to:

$$\frac{Vt.\lambda}{I}\ln\left(\frac{\lambda}{n}\right)$$

where 1n is a natural logarithm, I is an output current of said first current source output, Vt is a thermal voltage, $\lambda$ is said predetermined ratio, and n is a number of transistors forming said first transistor.

4. An amplifier as claimed in claim 1, comprising cross-connected first and second differential pairs of transistors, said first and second long tail pairs having outputs connected to said cross-connected first and second differential pairs of transistors.

5. An amplifier as claimed in claim 1, having first and second inputs and third and fourth resistances, said first long tail pair comprising third and fourth transistors having input terminals connected to said first and second inputs, respectively, and common terminals connected via said third and fourth resistances, respectively, to said first current source output.

6. An amplifier as claimed in claim 5, in which said third and fourth transistors are bipolar transistors, said second amplifier input is connected at signal frequencies to a common line, and a value of said third resistance is substantially equal to a value of said fourth resistance plus $(Zs/\beta_1)$, where Zs is a source impedance to which said first amplifier input is to be connected and $\beta_1$ is a current gain of said third transistor.

7. An amplifier as claimed in claim 6, comprising fifth and sixth resistances, said third and fourth transistors having output terminals and said second long tail pair comprising fifth and sixth transistors having input terminals connected to said first and second inputs, respectively, common terminals connected via said fifth and sixth resistances, respectively, to said second current source output, and output terminals connected to said output terminals of said fourth and third transistors, respectively.

8. An amplifier as claimed in claim 7, in which said fifth and sixth transistors are bipolar transistors and a value of said fifth resistance is substantially equal to a value of said sixth resistance plus ($Zs/\beta_2$), where $\beta_2$ is a current gain of said fifth transistor.

9. An amplifier comprising: a first current source; a first resistance; a first bipolar transistor having a collector, a base for connection to a signal source having a source impedance Zs and an emitter connected via said first resistance to said first current source; a second resistance; and a second bipolar transistor having a collector, a base connected at signal frequencies to a common line and an emitter connected via said second resistance to said first current source, a value of said first resistance being substantially equal to a value of said second resistance plus ($Zs/\beta_1$), where $\beta_1$ is a current gain of said first transistor.

10. An amplifier as claimed in claim 9, comprising: a second current source; a third resistance; a third bipolar transistor having a base connected to said base of said first transistor, an emitter connected via said third resistance to said second current source, and a collector connected to said collector of said second transistor; a fourth resistance; and a fourth bipolar transistor having a base connected to said base of said second transistor, an emitter connected via said fourth resistance to said second current source, and a collector connected to said collector of said first transistor, a value of said third resistance being substantially equal to a value of said fourth resistance plus ($Zs/\beta_2$), where $\beta_2$ is a current gain of said third transistor.

11. An amplifier as claimed in claim 10, comprising a capacitor connecting said base of said second transistor to said common line.

12. A radio tuner including an amplifier comprising a first long tail pair of transistors, a second long tail pair of transistors, and a constant current source for setting tail currents of the first and second long tail pairs in a predetermined ratio, the current source comprising: a supply input; a first resistance; a second resistance; at least one first bipolar transistor having a collector forming a first constant current source output, a base connected to a bias voltage source, and an emitter connected exclusively via said first resistance to said supply input; and a second bipolar transistor having a collector forming a second constant current source output, a base connected to said bias voltage source, and an emitter connected exclusively via said second resistance to said emitter of said first transistor so that said emitter of said second transistor is connected to said supply input exclusively via said first and second resistances in series.

13. A radio turner including an amplifier comprising: a first current source; a first resistance; a first bipolar transistor having a collector, a base for connection to a signal source having a source impendance Zs and an emitter connected via said first resistance to said first current source; a second resistance; and a second bipolar transistor having a collector, a base connected at signal frequencies to a common line and an emitter connected via said second resistance to said first current source, a value of said first resistance being substantially equal to a value of said resistance plus ($Zs/\beta_1$), where $\beta_1$ is a current gain of said first transistor.

* * * * *

UNITED STATES PATENT AND TRADEMARK OFFICE
CERTIFICATE OF CORRECTION

PATENT NO. : 6,876,843 B2
DATED : April 5, 2005
INVENTOR(S) : Arshad Madni et al.

It is certified that error appears in the above-identified patent and that said Letters Patent is hereby corrected as shown below:

Column 8,
Line 20, change "turner" to -- tuner --.
Line 23, change "impendance" to -- impedance --.

Signed and Sealed this

Twenty-eighth Day of June, 2005

JON W. DUDAS
*Director of the United States Patent and Trademark Office*